United States Patent
Seo et al.

(10) Patent No.: US 10,073,301 B2
(45) Date of Patent: Sep. 11, 2018

(54) LIQUID CRYSTAL DISPLAY AND METHOD OF MANUFACTURING THE SAME

(71) Applicant: Samsung Display Co., Ltd., Yongin, Gyeonggi-Do (KR)

(72) Inventors: Bong Sung Seo, Suwon-si (KR); Chang-Hun Lee, Hwaseong-si (KR); Baek Kyun Jeon, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 240 days.

(21) Appl. No.: 14/814,605

(22) Filed: Jul. 31, 2015

(65) Prior Publication Data
US 2016/0209710 A1 Jul. 21, 2016

(30) Foreign Application Priority Data
Jan. 19, 2015 (KR) ........................ 10-2015-0008684

(51) Int. Cl.
 G02F 1/1337 (2006.01)
 G02F 1/1333 (2006.01)
 (Continued)

(52) U.S. Cl.
 CPC ........ G02F 1/133788 (2013.01); G02F 1/137 (2013.01); G02F 1/1341 (2013.01);
 (Continued)

(58) Field of Classification Search
 CPC ............. G02F 1/1343; G02F 1/133788; G02F 1/133345; G02F 1/133512; G02F 1/1341;
 (Continued)

(56) References Cited

U.S. PATENT DOCUMENTS 6,248,410 B1 6/2001 Ichinose et al.
6,469,765 B1 10/2002 Matsuyama et al.
(Continued)

FOREIGN PATENT DOCUMENTS

JP 09-061842 A 3/1997
JP 3465835 B2 11/2003
(Continued)

OTHER PUBLICATIONS

Extended European Search Report for European Patent Application No. 15187055.7 dated Dec. 18, 2015.

*Primary Examiner* — Nathanael R Briggs
(74) *Attorney, Agent, or Firm* — Cantor Colburn LLP

(57) ABSTRACT

A liquid crystal display includes a first substrate, a gate line on the first substrate, a thin film transistor on the first substrate and connected to the gate line, a first electrode and a second electrode on the first substrate, an insulating layer between the first electrode and the second electrode, a second substrate facing the first substrate, and a liquid crystal layer between the first substrate and the second substrate and including a liquid crystal molecule. One of the first electrode and the second electrode includes a plurality of branch electrodes extending in an extension direction parallel to the gate line, and the other one of the first electrode and the second electrode has a planar shape. The liquid crystal molecule of the liquid crystal layer has negative dielectric anisotropy.

20 Claims, 7 Drawing Sheets

(51) Int. Cl.
*G02F 1/1335* (2006.01)
*G02F 1/1343* (2006.01)
*G02F 1/137* (2006.01)
*G02F 1/1341* (2006.01)
*G02F 1/1362* (2006.01)
*G02F 1/1368* (2006.01)
*H01L 27/12* (2006.01)

(52) U.S. Cl.
CPC ........ *G02F 1/1368* (2013.01); *G02F 1/13439* (2013.01); *G02F 1/133345* (2013.01); *G02F 1/133512* (2013.01); *G02F 1/134309* (2013.01); *G02F 1/134363* (2013.01); *G02F 1/136286* (2013.01); *H01L 27/124* (2013.01); *H01L 27/1259* (2013.01); *G02F 2001/13712* (2013.01); *G02F 2001/133397* (2013.01); *G02F 2001/133738* (2013.01); *G02F 2001/134372* (2013.01); *G02F 2001/136295* (2013.01)

(58) Field of Classification Search
CPC ........ G02F 1/134309; G02F 1/134363; G02F 1/13439; G02F 1/136286; G02F 1/1368; G02F 1/137; G02F 2001/133397; G02F 2001/133738; G02F 2001/134372; G02F 2001/136295; G02F 2001/13712; H01L 27/124; H01L 27/1259
See application file for complete search history.

(56) References Cited

U.S. PATENT DOCUMENTS

| | | | |
|---|---|---|---|
| 7,615,260 B2 | 11/2009 | Yoneya et al. | |
| 2004/0057003 A1* | 3/2004 | Yoo | G02F 1/133707 349/141 |
| 2007/0030431 A1* | 2/2007 | Lee | G02F 1/133753 349/141 |
| 2014/0092353 A1* | 4/2014 | Matsushima | G02F 1/133512 349/110 |
| 2014/0254014 A1* | 9/2014 | Ishiguro | G02B 5/3083 359/489.07 |
| 2015/0009459 A1* | 1/2015 | Iwata | G02F 1/134309 349/98 |
| 2016/0116770 A1* | 4/2016 | Fukaya | G02F 1/134363 349/110 |
| 2016/0178969 A1* | 6/2016 | Miyake | G02F 1/133788 445/22 |
| 2016/0299394 A1* | 10/2016 | Yoshida | G02F 1/134363 |

FOREIGN PATENT DOCUMENTS

| | | |
|---|---|---|
| KR | 1020050047752 A | 5/2005 |
| KR | 1020100000682 A | 1/2010 |
| KR | 10-1247698 B1 | 3/2013 |

* cited by examiner

LIQUID CRYSTAL DISPLAY AND METHOD OF MANUFACTURING THE SAME

This application claims priority to Korean Patent Application No. 10-2015-0008684 filed on Jan. 19, 2015, and all the benefits accruing therefrom under 35 U.S.C. § 119, the entire contents of which are incorporated herein by reference.

BACKGROUND (a) Field

The invention relates to a liquid crystal display and a method of manufacturing the same.

(b) Description of the Related Art

A liquid crystal display which is one of the most widely used flat panel displays, includes two display panels on which field generating electrodes such as a pixel electrode and a common electrode are disposed, and a liquid crystal layer interposed between the two display panels. The liquid crystal display displays images by applying voltage to the field generating electrodes to produce an electric field in the liquid crystal layer, through which alignment of liquid crystal molecules of the liquid crystal layer is determined, and controlling polarization of incident light thereto.

In order to increase display quality of a liquid crystal display, implementing a liquid crystal display having a relatively high contrast ratio, excellent wide viewing angle and quick response speed is desired. In addition to increasing the display quality of the liquid crystal display, preventing display quality deterioration thereof is also desired. Such display deterioration may be a result of stains generated due to disarrangement of liquid crystal molecule caused by an external influence to the liquid crystal display such as pressure and the like.

SUMMARY

For a liquid crystal layer of a liquid crystal display, liquid crystals in the liquid crystal layer include a positive dielectric anisotropy liquid crystal and a negative dielectric anisotropy liquid crystal. The negative dielectric anisotropy liquid crystal has a relatively high rotational elastic energy due to a small splay angle of surrounding liquid crystals, as compared with the positive dielectric anisotropy liquid crystal. Thus, the negative dielectric anisotropy liquid crystal has relatively high transmittance.

However, since the negative dielectric anisotropy liquid crystal includes more ionic impurities than the positive dielectric anisotropy liquid crystal, severe afterimage may be generated by using the negative dielectric anisotropy liquid crystal.

One or more exemplary embodiment of the invention provides a liquid crystal display and a method of manufacturing the same to improve a display quality of the liquid crystal display by reducing afterimage.

An exemplary embodiment of the invention provides a liquid crystal display including a first substrate, a gate line on the first substrate, a thin film transistor disposed on the first substrate and connected to the gate line, a first electrode and a second electrode on the first substrate, an insulating layer between the first electrode and the second electrode, a second substrate facing the first substrate, and a liquid crystal layer between the first substrate and the second substrate and including a liquid crystal molecule. One of the first electrode and the second electrode includes a plurality of branch electrodes, and the other one of the first electrode and the second electrode has a planar shape. The plurality of the branch electrodes extends in an extension direction parallel to the gate line. The liquid crystal molecule of the liquid crystal layer has negative dielectric anisotropy.

A major axis of the liquid crystal molecule may form a tilt angle with a direction perpendicular to the extension direction of the plurality of the branch electrodes in a state of no electric field applied to the liquid crystal layer.

The plurality of the branch electrodes of the one of the first electrode and the second electrode may overlap the planar shape of the other one of the first electrode and the second electrode.

The one of the first electrode and the second electrode including the plurality of branch electrodes may be connected to the thin film transistor.

The liquid crystal display may further include a photo-alignment layer on the plurality of the branch electrodes of the one of the first electrode and the second electrode. The photo-alignment layer may determine the tilt angle of the liquid crystal molecule.

The liquid crystal display may further include a data line connected to the thin film transistor and intersecting the gate line. The data line may extend in a straight line.

The liquid crystal display may further include a transverse light blocking member extending in an extension direction parallel to the extension direction of the plurality of the branch electrodes, the transverse light blocking member overlapping the gate line, and a longitudinal light blocking member extending in an extension direction perpendicular to the extension direction of the plurality of the branch electrodes, the longitudinal light blocking member overlapping the data line may be further included. A width of the transverse light blocking member taken perpendicular to the extension direction thereof may be larger than a width of the longitudinal light blocking member taken perpendicular to the extension direction thereof.

The gate line and the data line may perpendicularly intersect each other.

A plurality of pixels may be defined on the first substrate, each pixel among the plurality of the pixels including a short sides in the extension direction of the plurality of branch electrodes and a long side in a direction perpendicular to the extension direction of the plurality of the branch electrodes.

The photo-alignment layer may be a photo-degradable alignment layer.

A plurality of pixels may be defined on the first substrate, each pixel among the plurality of the pixels may include an upper region and a lower region. A major axis of the liquid crystal molecule disposed in the upper region forms a first tilt angle with the direction perpendicular to the extension direction of the plurality of the branch electrodes in the state of no electric field applied to the liquid crystal layer, and a major axis of the liquid crystal molecule disposed in the lower region forms a second tilt angle with the direction perpendicular to the extension direction of the plurality of the branch electrodes in the state of no electric field applied to the liquid crystal layer. The first tilt angle and the second tilt angle may be different from each other.

A plurality of pixels may be defined on the first substrate, among which a first pixel is adjacent to a second pixel and a plurality of liquid crystal molecules is disposed in each of the first pixel and the second pixel. A major axis of each of the liquid crystal molecules disposed in the first pixel forms a first tilt angle with the direction perpendicular to the extension direction of the plurality of the branch electrodes in the state of no electric field applied to the liquid crystal layer, and a major axis of each of the liquid crystal molecules disposed in the second pixel forms a second tilt angle with the direction perpendicular to the extension direction of the plurality of the branch electrodes in the state of no electric field applied to the liquid crystal layer. The first tilt angle and the second tilt angle may be different from each other.

The tilt angle may be about 5 degrees to about 10 degrees.

When the liquid crystal layer includes ionic impurities, the ionic impurities in the liquid crystal layer may be accumulated at the gate line.

The transverse light blocking member extending in the extension direction parallel to the extension direction of the plurality of the branch electrodes may overlap the ionic impurities accumulated at the gate line.

Another exemplary embodiment of the invention provides a method of manufacturing a liquid crystal display including forming a thin film transistor connected to a gate line, on a first substrate, forming a first electrode and a second electrode, and an insulating layer between the first electrode and the second electrode, on the first substrate, forming a photo-alignment layer on the first electrode or the second electrode, disposing the first substrate facing a second substrate, and forming a liquid crystal layer between the second substrate facing the first substrate, the liquid crystal layer including a liquid crystal molecule. One of the first electrode and the second electrode includes a plurality of branch electrodes extending in an extension direction parallel to the gate line, and the other one of the first electrode and the second electrode has a planar shape, and the liquid crystal molecule included in the liquid crystal layer has negative dielectric anisotropy.

The method may further include forming a data line connected to the thin film transistor and intersecting the gate line. The data line may extend in a straight line.

The method may further include forming a transverse light blocking member extending in an extension direction parallel to the extension direction of the plurality of the branch electrodes, the transverse light blocking member overlapping the gate line, and forming a longitudinal light blocking member extending in an extension direction perpendicular to the extension direction of the plurality of the branch electrodes, the longitudinal light blocking member overlapping the data line. A width of the transverse light blocking member taken perpendicular to the extension direction thereof is larger than a width of the longitudinal light blocking member taken perpendicular to the extension direction thereof.

The method may further include defining a plurality of pixels on the first substrate, a pixel among the plurality of pixels including an upper region and a lower region. The forming the photo-alignment layer may include masking the lower region of the pixel to incline a major axis of the liquid crystal molecule in the upper region at a first tilt angle, and masking the upper region of the pixel to incline a major axis of the liquid crystal molecule in the lower region at a second tilt angle, where the first tilt angle and the second tilt angle are formed different from each other.

The method may further include defining a plurality of pixels on the first substrate, for which a first pixel is adjacent to a second pixel and a plurality of liquid crystal molecules is disposed in each of the first pixel and the second pixel. The forming the photo-alignment layer may include masking the second pixel to incline a major axis of the liquid crystal molecules in the first pixel at a first tilt angle, and masking the first pixel to incline a major axis of the liquid crystal molecules in the second pixel at a second tilt angle, where the first tilt angle and the second tilt angle are different from each other.

According to one or more exemplary embodiment of the invention, branch electrodes of a field-generating electrodes extend in a short side direction of a pixel, and an initial alignment direction of liquid crystal molecules forms a predetermined tilt angle perpendicular to the short side direction of the pixel, thereby improving the transmittance a liquid crystal display and reducing afterimage displayed by the liquid crystal display.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
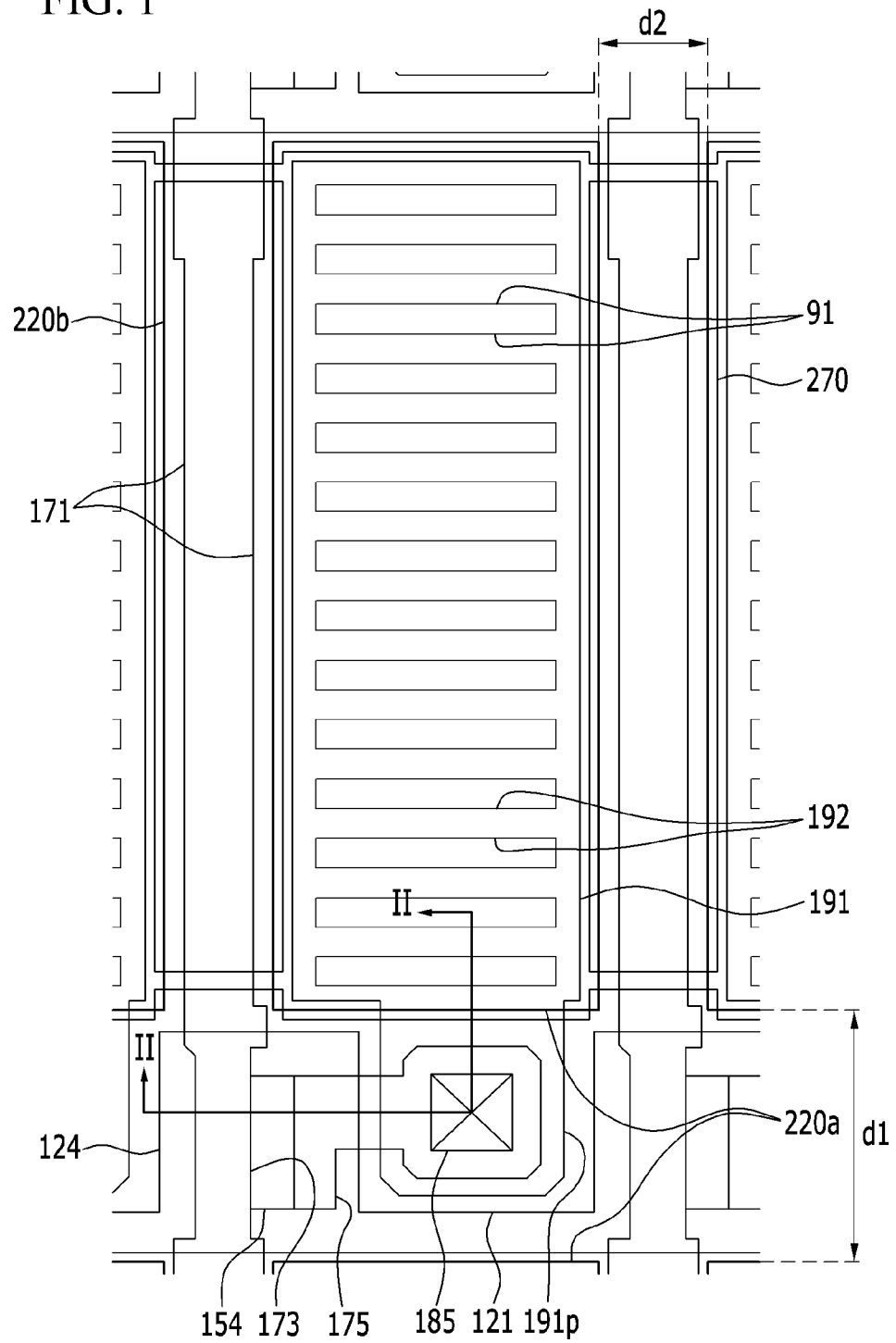
FIG. 1 is a top plan view showing an exemplary embodiment of a liquid crystal display according to the invention.

Referring to accompanying drawings, exemplary embodiments of the invention will be described in detail. However, the invention is not limited to the exemplary embodiments described herein, and may be embodied in other forms. Rather, the exemplary embodiments introduced herein are provided so that the disclosure may become thorough and complete, and the spirit of the invention may be sufficiently delivered to those skilled in the art.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. In the drawings, the thicknesses of layers and regions are exaggerated for clarity Further, when a layer is referred to as being "on" another element or substrate, the layer may be directly formed on another layer or substrate, or intervening elements may be present therebetween. Throughout the specification, identical reference numerals designate identical elements.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
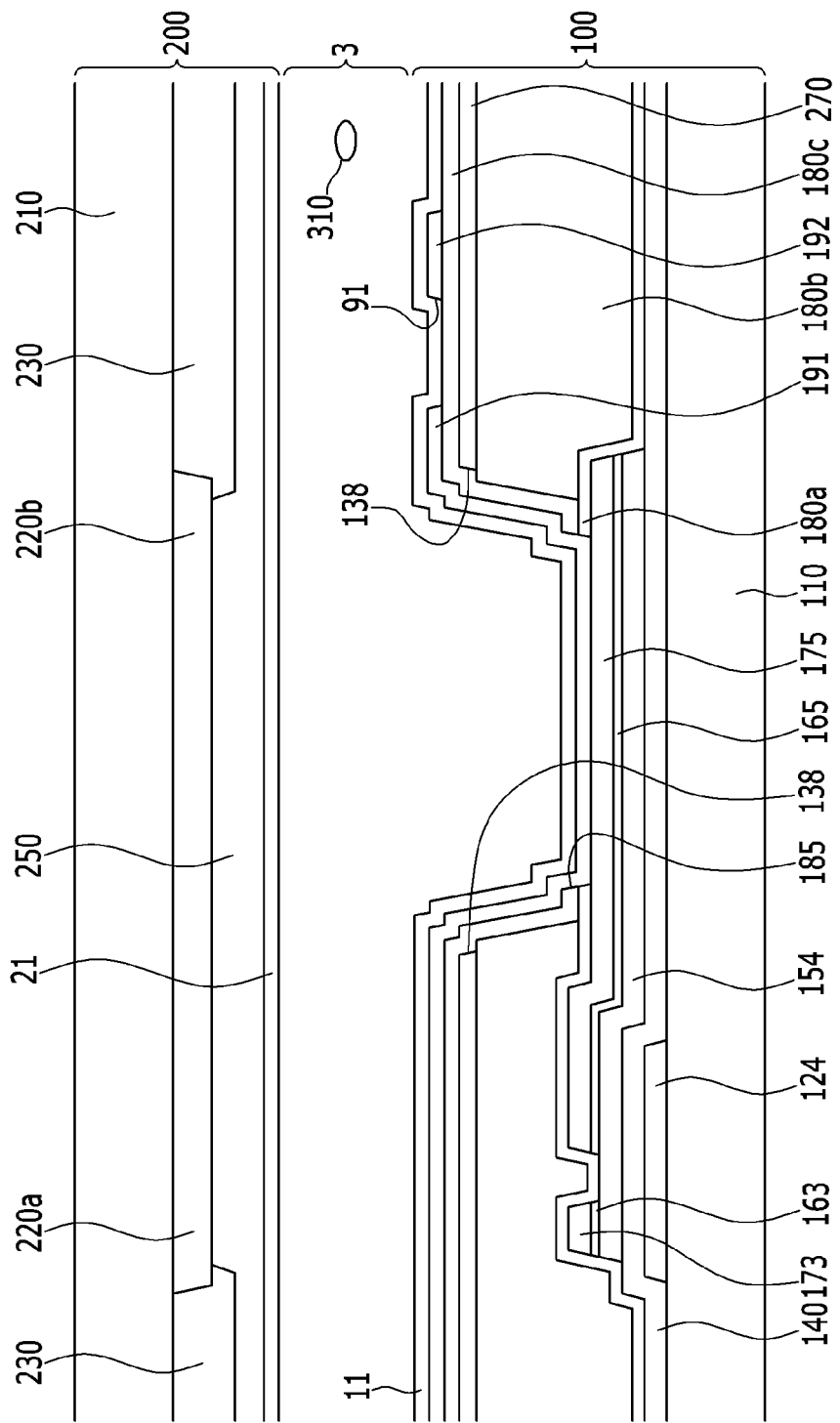
FIG. 2 is a cross-sectional view taken along line II-II of FIG. 1.
Figure 3:
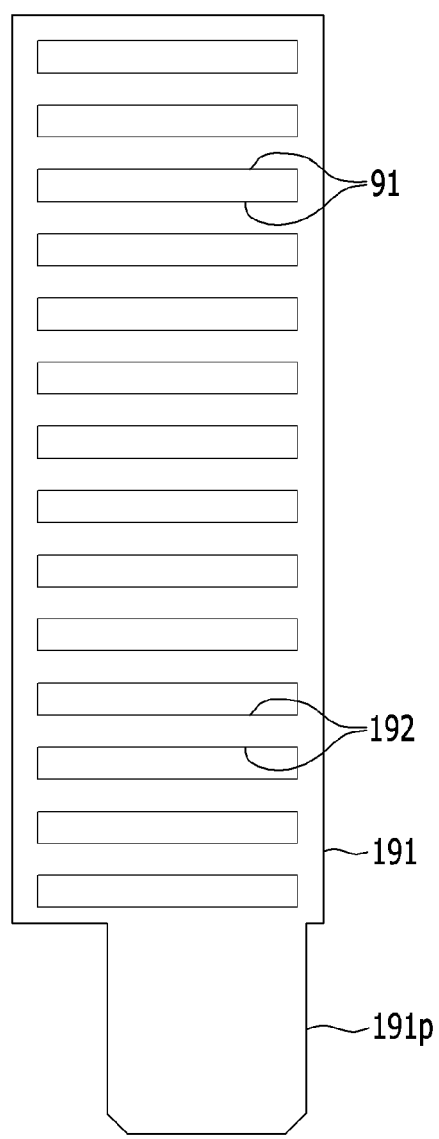
FIG. 3 is a top plan view showing an exemplary embodiment of an electrode structure in the liquid crystal display of FIG. 1.

FIG. 1 is a top plan view showing an exemplary embodiment of a liquid crystal display according to the invention. FIG. 2 is a cross-sectional view taken along line II-II of FIG. 1. FIG. 3 is a top plan view showing an exemplary embodiment of an electrode structure in the liquid crystal display of FIG. 1.

Referring to FIGS. 1 and 2, a liquid crystal display includes a lower display panel 100 and an upper display panel 200 facing each other, and a liquid crystal layer 3 interposed therebetween. The liquid crystal display may include a display area in which an image is displayed, and a non-display area except for the display area and in which an image is not displayed. The display area may include a plurality of pixels. A pixel may include a display region in which the image is displayed and a non-display region excluding the display region in which the image is not displayed.

First, the lower display panel 100 will be described.

A first substrate 110 includes a transparent glass, plastic or the like. A gate conductor including a gate line 121 is disposed on the first substrate 110.

The gate line 121 may include a relatively wide end portion (not shown) for connection with another layer or an external driving circuit (not shown) and a gate electrode 124 protruding from a main portion thereof. The gate line 121 may include an aluminum (AD-based metal such as aluminum or an aluminum alloy, a silver (Ag)-based metal such as silver or a silver alloy, a copper (Cu)-based metal such as copper or a copper alloy, a molybdenum (Mo)-based metal such as molybdenum or a molybdenum alloy, chromium (Cr), tantalum (Ta), titanium (Ti) and the like. The gate line 121 and portions thereof may have a single (e.g., monolayer) structure or may have a multilayer structure including at least two conductive layers having different physical properties from each other. A gate conductor of the liquid crystal display includes the gate line 121 and the gate electrode 124. The gate line 121 transmits a gate signal, and extends to extend in a horizontal direction of the plan view.

On the gate line 121, a gate insulating layer 140 is disposed. The gate insulating layer 140 includes silicon nitride (SiNx), silicon oxide (SiOx) or the like. The gate insulating layer 140 may have a single (e.g., monolayer) structure or a multilayer structure including at least two insulating material layers having different physical properties from each other.

On the gate insulating layer 140, a semiconductor layer 154 is disposed. The semiconductor layer 154 includes amorphous silicon, polysilicon or the like. The semiconductor layer 154 may include an oxide semiconductor.

On the semiconductor layer 154, ohmic contacts 163 and 165 are disposed. The ohmic contacts 163 and 165 may include a material such as n+ hydrogenated amorphous silicon doped with n-type impurities such as phosphorus at high concentration, or may include silicide. The ohmic contacts 163 and 165 form a pair of ohmic contacts disposed on the semiconductor layer 154. In an exemplary embodiment, where the semiconductor layer 154 is an oxide semiconductor, the ohmic contacts 163 and 165 may be omitted.

On the ohmic contacts 163 and 165 and the gate insulating layer 140, a data line 171 and a drain electrode 175 are disposed. The data line 171 includes a source electrode 173 protruded from a main portion thereof. A data conductor of the liquid crystal display includes the data line 171, the source electrode 173 and the drain electrode 175.

The data line 171 includes a relatively wide end portion (not shown) for connection with another layer or an external driving circuit (not shown). The data line 171 transmits a data signal, and extends in a vertical direction of the plan view to intersect the gate line 121.

Herein, the data line 171 may extend in an extension direction along the vertical direction, while intersecting the gate line 121. The data line 171 may not be bent and may be entirely disposed in a straight line along the vertical direction. In an exemplary embodiment, the data line 171 may intersect the gate line 121 perpendicularly.

The source electrode 173 may be a portion of the data line 171, and disposed on the same line as that of the data line 171. The source electrode 173 may extend in the same extension direction as that of the data line 171. The drain electrode 175 includes a portion extending parallel to the source electrode 173. Therefore, such an extended portion of the drain electrode 175 is parallel to a portion of the data line 171.

The gate electrode 124, the source electrode 173 and the drain electrode 175 collectively form one thin film transistor ("TFT") together with the semiconductor layer 154. A channel of the TFT is formed by a portion of the semiconductor layer 154 exposed between the source electrode 173 and the drain electrode 175.

The above-described exemplary embodiment of the liquid crystal display according to the invention includes the source electrode 173 disposed on the same line as the data line 171, and the drain electrode 175 disposed to face the source electrode 173 while being parallel to the data line 171, thereby broadening a width of the TFT without widening an area occupied by the data conductor within the TFT. Accordingly, an aperture ratio of the liquid crystal display may be increased.

The data line 171 and the drain electrode 175 (e.g., the data conductor) includes a refractory metal such as molybdenum, chromium, tantalum, titanium, an alloy thereof or a combination of one of the foregoing. The data line 171 and drain electrode 175 may have a multilayer structure including a refractory metal layer (not shown) and a low resistant conductive layer (not shown). Examples of the multilayer structure include a double layer of chromium or molybdenum (alloy) lower layer and aluminum (alloy) upper layer, and a triple layer of molybdenum (alloy) lower layer, aluminum (alloy) intermediate layer and molybdenum (alloy) upper layer.

On exposed portions of the data conductor 171, 173 and 175, the gate insulating layer 140 and the semiconductor layer 154, a first passivation layer 180a is disposed. The first passivation layer 180a may include an organic insulating material, an inorganic insulating material or the like.

On the first passivation layer 180a, a second passivation layer 180b is disposed. The second passivation layer 180b may include an organic insulator.

In an exemplary embodiment, the second passivation layer 180b may be a color filter. Where the second passivation layer 180b is a color filter, the second passivation layer 180b may uniquely display one of primary colors. The primary colors may include three primary colors of red, green and blue, or yellow, cyan, magenta or the like. In an exemplary embodiment the color filter may display a combination of primary colors or may be display a white color, in addition to the color filter displaying individual primary colors. Where the second passivation layer 180b of the lower display panel 100 is the color filter, a color filter 230 an upper display panel 200 described below may be omitted.

In another exemplary embodiment, the second passivation layer 180b of the lower display panel 100 includes an organic insulating material. Where the second passivation layer 180b includes the organic insulating material, a color filter (not shown) of the lower display panel 100 may be disposed between the first passivation layer 180a and the second passivation layer 180b.

On the second passivation layer 180b, a common electrode 270 is disposed within the lower display panel 100. The common electrode 270 may have a planar shape in a portion corresponding to a pixel, and may have defined therein an opening 138 disposed in a region surrounding of the drain electrode 175.

The liquid crystal display may include a plurality of common electrodes 270. Common electrodes 270 disposed in adjacent pixels may be connected to each other, so that common voltage having a certain level supplied from the outside of a display area of the liquid crystal display may be received by all the common electrodes 270.

On the common electrode 270, an insulating layer 180c is disposed. The insulating layer 180c may include an organic insulating material, an inorganic insulating material or the like.

On the insulating layer 180c, a pixel electrode 191 is disposed. In an exemplary embodiment of the liquid crystal display according to the invention, a pixel may be defined as a region formed by the gate line 121 and the data line 171 intersecting each other, but the invention is not limited thereto. The pixel may have a short side and a long side longer than the short side. The pixel may be a minimum unit forming an image. In the pixel electrode 191 is defined a plurality of cutouts 91 which defines a plurality of branch electrodes 192 disposed between neighboring cutouts 91. Referring to FIG. 3, a plurality of the cutouts 91 is parallel to each other, and between adjacent cutouts 91, a branch electrode 192 is disposed. The plurality of cutouts 91 and the plurality of branch electrodes 192 may not be bent and may be entirely disposed in a straight line along the horizontal direction.

In the plan view, below the pixel electrode 191, a protrusion 191p is extended from a main portion of the pixel electrode 191 for connection with the drain electrode 175.

The plurality of the branch electrodes 192 extend in a short side direction of the pixel (e.g., a horizontal direction in FIG. 1). The short side direction of the pixel may be parallel to an extension direction of the gate line 121, and a long side direction of the pixel may be parallel to an extension direction of the data line 171. Consequently, the plurality of the branch electrodes 192 and the cutouts 91 may each extend parallel to the gate line 121.

The common electrode 270 is a first field generating electrode or a first electrode of the liquid crystal display, and the pixel electrode 191 may be a second field generating electrode or a second electrode of the liquid crystal display. The pixel electrode 191 and the common electrode 270 may form a fringe field or the like in the liquid crystal layer 3.

In the first passivation layer 180a, the second passivation layer 180b and the insulating layer 180c, a first contact hole 185 exposing the drain electrode 175 is defined. The protrusion 191p of the pixel electrode 191 is physically and electrically connected to the drain electrode 175 via the contact hole 185, thereby receiving voltage from the drain electrode 175.

On the pixel electrode 191 and the insulating layer 180c, a first alignment layer 11 is disposed. The first alignment layer 11 includes a photo-alignment layer.

In an exemplary embodiment, the photo-alignment layer may undergo photolysis to form a photo-degradable alignment layer. In an exemplary embodiment of manufacturing a liquid crystal display, for example, the first alignment layer 11 may be formed by polymerizing at least one of cyclobutanedianhydride ("CBDA") or a cyclobutanedianhydride ("CBDA") derivative with a diamine.

The cyclobutanedianhydride ("CBDA") and the cyclobutanedianhydride ("CBDA") derivative may include a compound represented by following Chemical Formula 1:

Chemical Formula 1

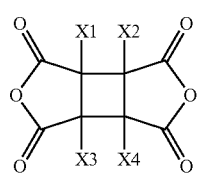

where X1, X2, X3 and X4 are independently of one another, hydrogen, halogen, an unsubstituted or substituted alkyl group, an unsubstituted or substituted aryl group, or an unsubstituted or substituted heteroaryl group. When X1 to X4 are all hydrogen, the compound may be cyclobutanedianhydride, as represented by following Chemical Formula 1-1.

Chemical Formula 1-1

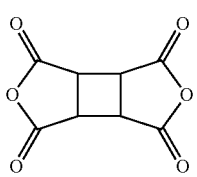

The cyclobutandianhydride derivative includes a compound represented the following Chemical Formulas 1-2 or 1-3.

Chemical Formula 1-2

Chemical Formula 1-3

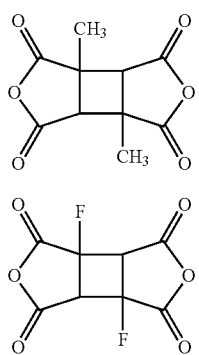

In the exemplary embodiment, the diamine may be a first diamine including an alkylene group as represented by $—C_kH_{2k}—$, in which k is a natural number. The first diamine may be a compound represented by following Chemical Formula 2:

Chemical Formula 2

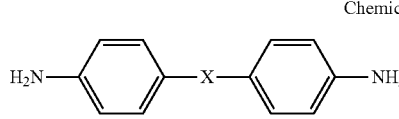

-continued where X is $—(CH_2)_h—$, $—S—(CH_2)_h—S—$, $—O—(CH_2)_h—O—$, $—O—\overset{O}{\underset{\|}{C}}—(CH_2)_h—\overset{O}{\underset{\|}{C}}—O—$, $—(CH_2OCH_2)_h—$, $—O—\overset{O}{\underset{\|}{C}}—(CH_2OCH_2)_h—\overset{O}{\underset{\|}{C}}—O—$, $—\overset{O}{\underset{\|}{C}}—O—(CH_2OCH_2)_h—O—\overset{O}{\underset{\|}{C}}—$, $—O—(CH_2OCH_2)_h—O—$, $—\overset{O}{\underset{\|}{C}}—O—(CH_2)_h—O—\overset{O}{\underset{\|}{C}}—$, $—CH_{2h1}—O—CH_{2h2}—$, or $—(CH_2)_{h1}\overset{O}{\underset{\|}{C}}—O—(CH_2)_{h2}—$;

in which h is a natural number from 1 to 10; and h1 and h2 are natural numbers selected so that the sum of carbon atoms in the alkylene group of X is 2 to 10.

The photo-alignment agent according to the exemplary embodiment may further include a second diamine represented by following Chemical Formula 3:

Chemical Formula 3

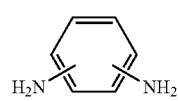

The second diamine may be a compound of Chemical Formula 3 in which a hydrogen connected to a cyclic carbon is substituted with an alkyl group, a halogen, sulfur or the like.

The second diamine may be an aromatic diamine such as p-phenylenediamine, m-phenylenediamine, 2,5-diaminotoluene, 2,6-diaminotoluene, 4,4'-diaminobiphenyl, 3,3'-dimethyl-4,4'-diaminobiphenyl, 3,3'-dimethoxy-4,4'-diaminobiphenyl, diaminodiphenylmethane, diaminodiphenyl ether, 2,2'-diaminodiphenyl propane, bis(3,5-diethyl-4-aminophenyl)methane, diaminodiphenylsulfone, diaminobenzophenone, diaminonaphthalene, 1,4-bis(4-aminophenoxy)benzene, 1,4-bis(4-aminophenyl)benzene, 9,1 0-bis(4-aminophenyl)anthracene, 1,3-bis(4-aminophenoxy) benzene, 4,4'-bis(4-aminophenoxy)diphenylsulfone, 2,2-bis[4-(4-aminophenoxy)phenyl]propane, 2,2-bis(4-aminophenyl)hexafluoropropane and 2,2-bis[4-(4-aminophenoxy)phenyl]hexafluoropropane; an alicyclic diamine such as bis(4-aminocyclohexyl)methane and bis(4-amino-3-methylcyclohexyl)methane; or an aliphatic diamine such as tetramethylenediamine and hexamethylenediamine, and the like. However, the second diamine is not particularly limited thereto, and most diamines having an inflexible property, with the exception of first diamine compounds, may be used. In an exemplary embodiment, a molar ratio between the first diamine and the second diamine may be 1:99 to 99:1, such as about 20:80 to 50:50.

The upper display panel 200 will now be described.

A second substrate 210 may include a transparent glass, plastic or the like. Light blocking members 220a and 220b are disposed on the second substrate 210. The light blocking members 220a and 220b are also referred to as a black matrix, and reduce or effectively prevent light leakage. The light blocking members includes a transverse light blocking member 220a covering the TFT, extending in an extension direction of a gate line 121 and overlapping the source electrode 173, the drain electrode 175, the gate electrode 124 and the like. The light blocking members further include a longitudinal light blocking member 220b extending in an extension direction of a data line 171 and overlapping the data line 171.

Referring to FIG. 1, lengths of the respective light blocking members 220a and 220b are taken in extension directions thereof, while widths are taken in directions perpendicular to the extension directions thereof. In the exemplary embodiment illustrated in FIG. 1, the width d1 of the transverse light blocking member 220a is larger than the width d2 of the longitudinal light blocking member 220b. In the exemplary embodiment, an entirety of the branch electrodes 192 and the cutouts 91 extend parallel to an extension direction of a wider light blocking member among a plurality of extended light blocking members.

On the second substrate 210 a plurality of color filters 230 is disposed. Where the second passivation layer 180b within the lower display panel 100 is a color filter, or a color filter which is not the second passivation layer 180b is disposed within the lower display panel 100, the color filter 230 of the upper display panel 200 may be omitted. Different from the illustrated exemplary embodiment, the light blocking members 220a and 220b included in the upper display panel 200 may instead be disposed within the lower display panel 100.

On the color filter 230 and the light blocking members 220a and 220b, an overcoat 250 is disposed. The overcoat 250 may include an (organic) insulating material, and reduces or effectively prevents exposure of the color filter 230, while providing a flat surface within the upper display panel 200. In an exemplary embodiment, the overcoat 250 may be omitted.

On the overcoat 250, a second alignment layer 21 is disposed. The second alignment layer 21 may include a same material as and be formed from a same method as the first alignment layer 11 previously described.

In the exemplary embodiment, the liquid crystal layer 3 includes liquid crystal molecules 310 having negative dielectric anisotropy. The number of the liquid crystal molecule 310 shown in the drawing is one, but is a representative of a plurality of liquid crystal molecules having substantially identical properties to each other.

The liquid crystal of the liquid crystal layer 3 may be aligned so that a major axis direction thereof is parallel to the lower and upper display panels 100 and 200.

The pixel electrode 191 receives data voltage from the drain electrode 175, and a common electrode 270 receives common voltage having a certain level from a common voltage applying part (not shown) disposed in the outside of the display area of the liquid crystal display.

The pixel electrode 191 and the common electrode 270 which are field generating electrodes of the liquid crystal display may generate an electric field, thereby rotating the liquid crystal molecules 310 of the liquid crystal layer 3 positioned on or overlapping the two field generating electrodes 191 and 270 in a direction perpendicular to an electric field direction. Depending on the rotation direction of the liquid crystal molecules 310 as determined by the electric field applied thereto, the polarization of light passing through the liquid crystal layer 3 is varied to control display of an image by the liquid crystal display.

As such, by forming two field generating electrodes 191 and 270 within one single display panel such as the lower display panel 100, transmittance of the liquid crystal display may be increased, and a relatively wide viewing angle may be implemented.

Figure 4:
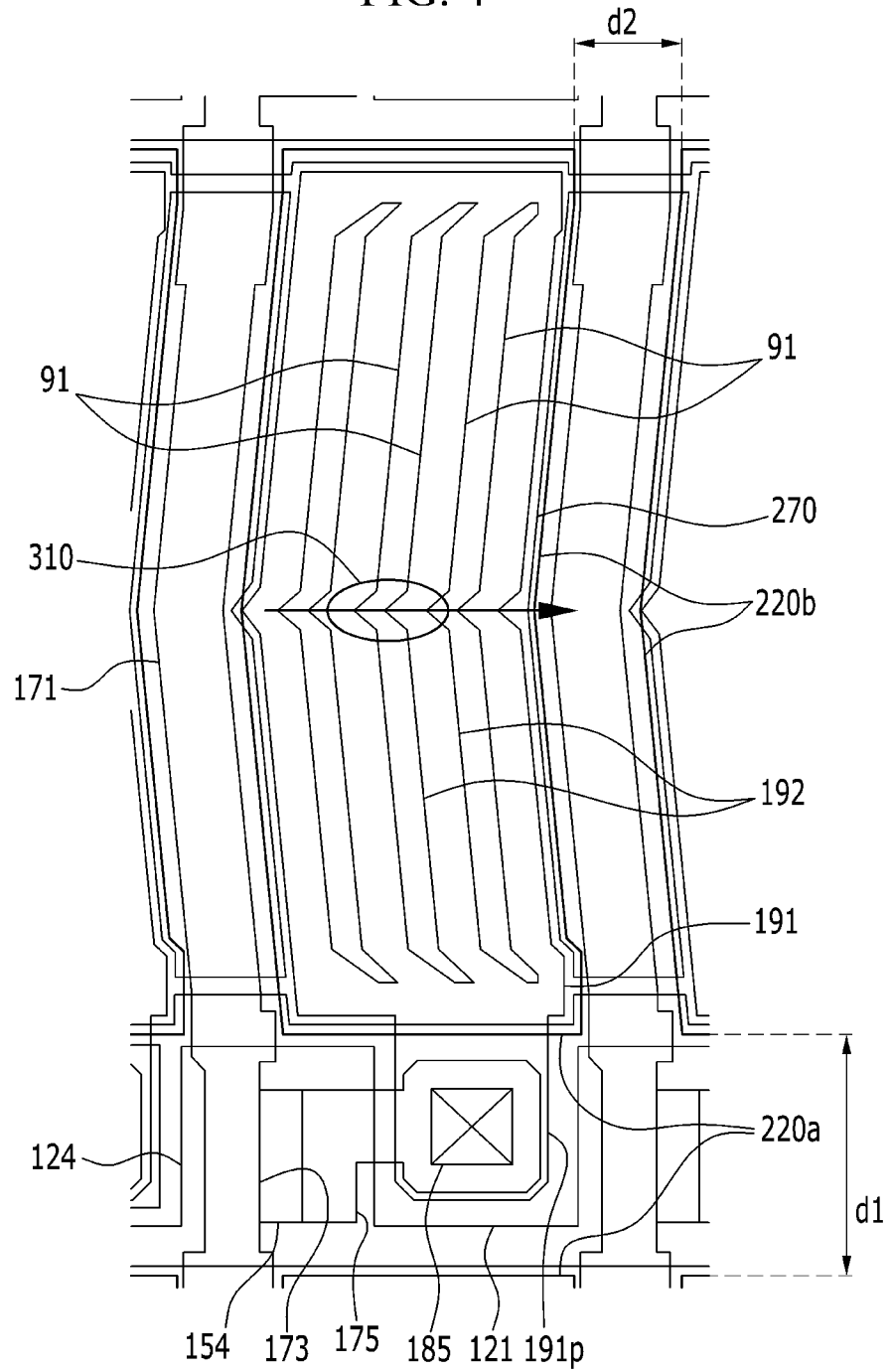
FIG. 4 is a top plan view showing a conventional liquid crystal display.

FIG. 4 is a top plan view showing a conventional liquid crystal display.

Referring to FIG. 4, in a conventional liquid crystal display in a plane-to-line switching ("PLS") mode, a plurality of branch electrodes 192 extend parallel to a longitudinal light blocking member 220b. As indicated by the horizontal arrow in FIG. 4, an initial alignment direction of liquid crystal molecules 310 in a state no electric field may be substantially perpendicular to an extension direction of the longitudinal light blocking member 220b. The liquid crystal display in a PLS mode refers to a liquid crystal driving mode by a plane-shaped (e.g., no cutouts defined at the liquid crystal layer) field generating electrode and a linear (e.g., with cutouts defined at the liquid crystal layer) field generating electrode overlapping each other with an insulating layer interposed therebetween.

Ionic impurities capable of causing a line afterimage may be present in a liquid crystal layer 3 disposed between field generating electrodes. The liquid crystal molecule 310 of the liquid crystal layer 3 may be vibrated by heat generated therefrom during driving of the liquid crystal display. As a result, the ionic impurities within the liquid crystal layer 3 may move in a major axis direction of the liquid crystal molecule 310. When the moved ionic impurities are accumulated, a viewable afterimage may be generated thereby to reduce display quality of the liquid crystal display. As shown in FIG. 4, where liquid crystal molecules 310 are initially aligned perpendicular to the branch electrode 192, the ionic impurities may move in a horizontal direction (indicated by the arrow) and may be accumulated at the longitudinal light blocking member 220b and an area adjacent thereto. Herein, since a width d2 of the longitudinal light blocking member 220b is smaller than a width d1 of the transverse light blocking member 220a, the afterimage generated due to the accumulated ionic impurities at the longitudinal light blocking member 220b is more visible.

In one or more exemplary embodiment according to the invention, since a plurality of branch electrodes 192 are elongated in an extension direction of a short side of the pixel, such extension direction being parallel to the gate line 121 and parallel to the wider light blocking member 220a, the initial alignment of the liquid crystal molecules 310 may be perpendicular to an extension direction of the branch electrodes 192 and the transverse light blocking member 220a. Accordingly, the ionic impurities within the liquid crystal layer 3 move in a major axis direction of the liquid crystal molecule 310, such that the ionic impurities are accumulated at the transverse light blocking member 220a and an area adjacent thereto. Since the width d1 of the transverse light blocking member 220a is relatively large as compared to the width d2 of the longitudinal light blocking member 220b, the afterimage generated due to the accumulated ionic impurities at the transverse light blocking member 220a is less viewable.

Figure 5:
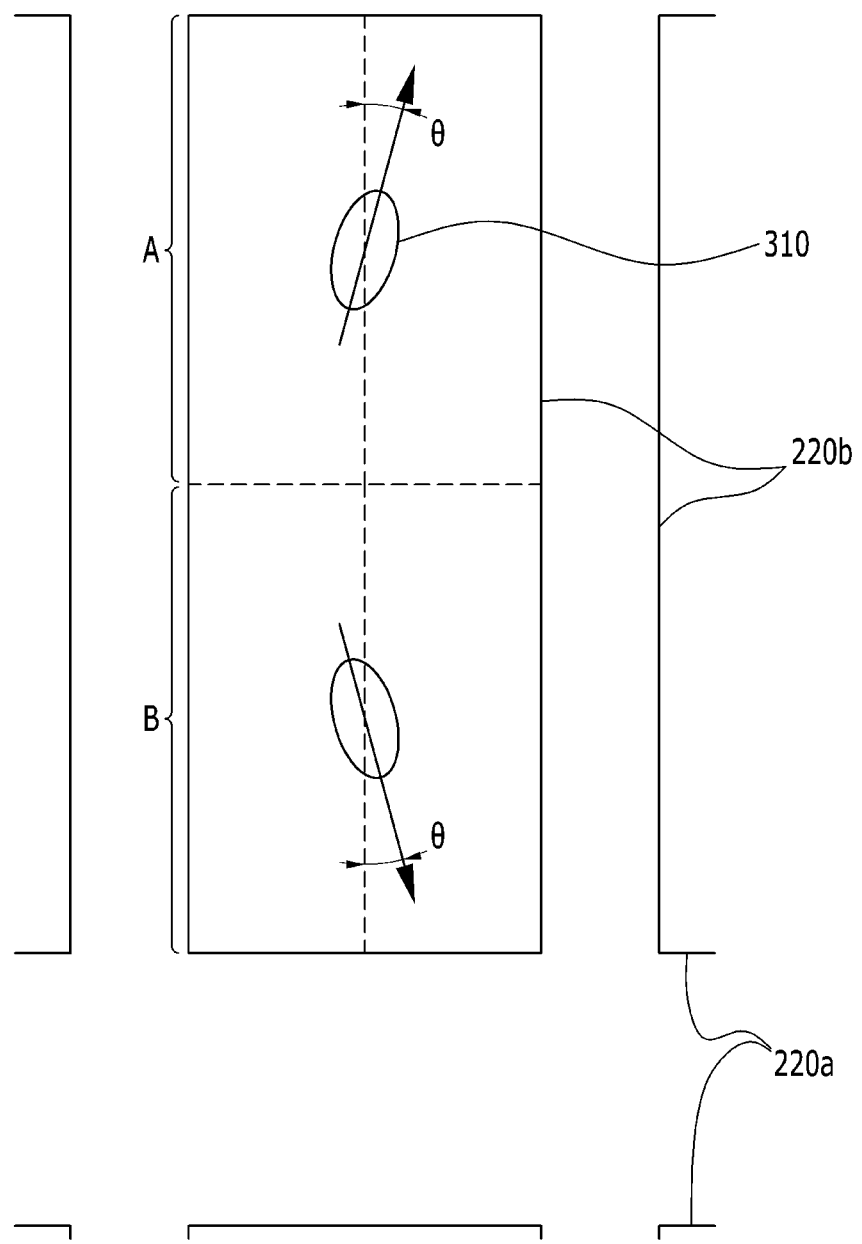
FIG. 5 is a schematic diagram showing an exemplary embodiment of an aligned state of a liquid crystal molecule in a liquid crystal display according to the invention.

FIG. 5 is a schematic diagram showing an exemplary embodiment of an aligned state of liquid crystal molecules in a liquid crystal display according to the invention.

Referring to FIG. 5, a major axis of the liquid crystal molecule 310 may be aligned in a direction substantially perpendicular to a transverse light blocking member 220a. In the exemplary embodiment, a pixel as a minimum unit forming an image (hereinafter referred to as a "unit pixel") includes an upper region A and a lower region B. A major axis of the liquid crystal molecule 310 in the upper region A is elongated in a first direction, and a major axis of the liquid crystal molecule 310 in the lower region B is elongated in a second direction. Herein, the first direction and the second direction may be different from each other. In an exemplary embodiment, for example, the first direction may be tilted or inclined by a predetermined tilt angle Θ taken in a same (rotational) direction with respect to a reference direction perpendicular to an extension direction of the transverse light blocking member 220a, the reference direction indicated by the vertical dotted line in FIG. 5. Due to the tilt angle of the inclined liquid crystal molecule 310 for each region in the unit pixel, two domains may be formed in the unit pixel, and transmittance thereof may be improved. In an exemplary embodiment of manufacturing a liquid crystal display, the tilt angles of the first direction and the second direction being different from each other may be formed by a photo-alignment process. In an exemplary embodiment, the predetermined tilt angle Θ may be about 1 degree(°) to about 10 degrees (°), such as about 5° to about 10°.

In the previously described exemplary embodiments of the liquid crystal display according to the invention, the common electrode 270 has a planar plane shape, and the pixel electrode 191 has a plurality of branch electrodes defined therein, but the invention is not limited thereto. In an alternative exemplary embodiment according to the invention, the pixel electrode 191 has a planar plane shape, and the common electrode 270 has a plurality of branch electrodes defined therein.

One or more exemplary embodiment according to the invention may be applied to any number of display devices in which a plane shape field generating electrode overlaps a field generating electrode having branch electrodes with an insulating layer interposed therebetween.

Figure 6:
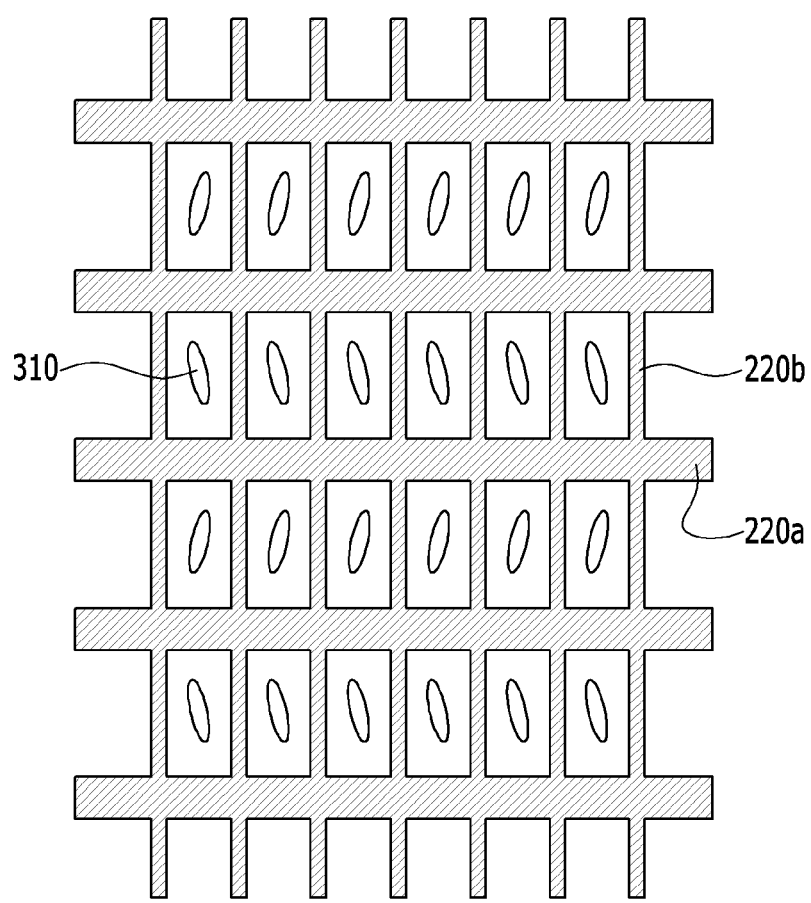
FIG. 6 is a schematic diagram showing an exemplary embodiment of aligned states of liquid crystal molecules in a plurality of pixels in a liquid crystal display according to the invention.

FIG. 6 is a schematic drawing showing an exemplary embodiment of aligned states of liquid crystal molecules in a plurality of pixels of a liquid crystal display according to the invention.

The structure of FIG. 6 is substantially the same as that of the exemplary embodiment described in FIGS. 1 to 3 and 5, but the liquid crystal molecules 310 positioned in a single one unit pixel of FIG. 6 may have a substantially identical alignment to each other within that single one unit pixel. The number of the liquid crystal molecule 310 illustrated in a unit pixel is one, but is only representative of a plurality of the liquid crystal molecules 310 within the same unit pixel having substantially identical properties as each other.

The liquid crystal display of FIG. 6 includes a plurality of unit pixels, and a first pixel and a second pixel vertically neighboring each other in the plan view among the plurality of the unit pixels have different liquid crystal alignments from each other. Within each unit pixel, the liquid crystal molecules 310 positioned therein have a substantially identical alignment to each other. In an exemplary embodiment of manufacturing a liquid crystal display, in order to form the above-described liquid crystal alignment, a photo-alignment layer having different alignment directions from each other may be respectively formed in areas of the first pixel and the second pixel.

Hereinafter, referring to FIG. 7, a method of manufacturing a liquid crystal display according to the invention, will be described. The invention is not limited to the exemplary embodiment described below but may be varied in other forms.

Figure 7:
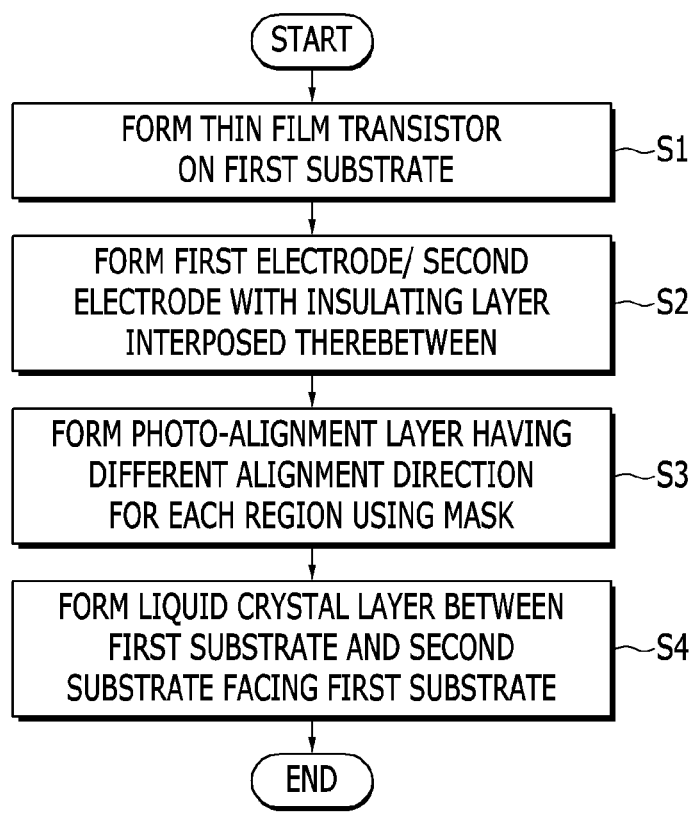
FIG. 7 is a flowchart showing an exemplary embodiment of a method of manufacturing a liquid crystal display according to the invention.

FIG. 7 is a flowchart showing an exemplary embodiment of a method of manufacturing a liquid crystal display according to the invention.

Referring to FIG. 7, a TFT is formed (e.g., provided) on a first substrate within a first display panel (S1). The TFT may collectively include a gate electrode 124, a source electrode 173, a drain electrode 175 and a semiconductor layer 154, such as described with respect to FIGS. 1 and 2.

One or more passivation layer is formed within the first display panel so as to cover the TFT. On the one or more passivation layer, a common electrode as a first electrode, an insulating layer, and a pixel electrode as a second electrode may be formed in turn within the first display panel (S2).

Thereafter, on the pixel electrode, one or more photo-alignment layer having different alignment directions corresponding to unit pixels and/or regions thereof is formed such as by using a mask.

A method of forming the photo-alignment layer will be described below.

On the pixel electrode, a photo-alignment agent material is applied, and the applied photo-alignment agent material is baked. An overall baking method may include more than one process such as a (first) prebaking process and a (second) hard baking process.

In the prebaking process, a portion of polyamic acid contained in the photo-alignment agent material may be converted into polyimide. Thereafter, the prebaked photo-alignment agent material may be irradiated with polarized light to form a photo-degradable alignment layer. As the irradiated light, ultraviolet rays in a range of about 240 nanometers (nm) to about 380 nm may be used. In an exemplary embodiment, ultraviolet rays at about 254 nm may be used. The polarized light may have energy of about 0.20 joule per squared centimeter ($J/cm^2$) to about 1.0 $J/cm^2$, such as about 0.40 $J/cm^2$ to about 0.50 $J/cm^2$.

Referring to S3 in FIG. 7 and the exemplary embodiment in FIG. 5, in a state where the lower region B of the unit pixel is masked, the upper region A of the unit pixel is irradiated with polarized light, thereby forming an alignment direction in the first direction. Thereafter, in a state where the upper region A of the unit pixel is masked, the lower region B of the unit pixel is irradiated with polarized light, thereby forming an alignment direction in the second direction.

Referring to S3 in FIG. 7 and the exemplary embodiment in FIG. 6, to make different alignment directions between vertically neighboring unit pixels, in a state where one of the neighboring unit pixels is irradiated with polarized light to form the alignment direction thereof, one or more other unit pixels to have a different alignment direction from that of the one neighboring unit pixel is masked.

In order to increase an alignment within the unit pixels, the photo-alignment layer may be baked once more (hereinafter, referred to as a second baking process). Herein, photolyzed molecules may be rearranged to increase anisotropy.

A second display panel is prepared, such as including elements or layers thereof formed on a second substrate.

Thereafter, a liquid crystal layer including the liquid crystal molecules is formed between the first display panel including the first substrate with layers thereon and the second display panel including the second substrate with layers thereon facing the first substrate (S4).

As above, exemplary embodiments of the invention have been described in detail, but the invention is not limited thereto. Variations and modifications by a person skilled in the art using a basic concept of the invention as defined in the claims below, also belong to the scope of the invention.

While this invention has been described in connection with what is presently considered to be practical exemplary embodiments, the invention is not limited to the disclosed exemplary embodiments, but, on the contrary, is intended to cover various modifications and equivalent arrangements included within the spirit and scope of the appended claims.

What is claimed is:

1. A liquid crystal display, comprising:
a first substrate,
a thin film transistor disposed on the first substrate,
a first electrode and a second electrode on the first substrate, one of which includes a plurality of branch electrodes and the other one of which has a planar shape, wherein the plurality of branch electrodes each extend in a same extension direction,
an insulating layer between the first electrode and the second electrode,
a transverse light blocking member lengthwise extended parallel to the extension direction of the branch electrodes,
a longitudinal light blocking member lengthwise extended perpendicular to the extension direction of the branch electrodes,
a second substrate facing the first substrate, and
a liquid crystal layer between the first substrate and the second substrate, the liquid crystal layer comprising a liquid crystal molecule, and the liquid crystal molecule having negative dielectric anisotropy,
wherein
a width of the transverse light blocking member taken perpendicular to the extension direction of the plurality of branch electrodes is larger than a width of the longitudinal light blocking member taken parallel to the extension direction of the plurality of branch electrodes, and
an initial alignment direction of the liquid crystal molecule in a state of no electric field is substantially perpendicular to an extension direction of the transverse light blocking member having the width larger than that of the longitudinal light blocking member.

2. The liquid crystal display of claim 1, wherein:
a major axis of the liquid crystal molecule forms a tilt angle with a direction perpendicular to the extension direction of the plurality of the branch electrodes in a state of no electric field applied to the liquid crystal layer.

3. The liquid crystal display of claim 2, wherein:
the plurality of the branch electrodes of the one of the first electrode and the second electrode overlaps the planar shape of the other one of the first electrode and the second electrode.

4. The liquid crystal display of claim 3, wherein:
the one of the first electrode and the second electrode including the plurality of branch electrodes is connected to the thin film transistor.

5. The liquid crystal display of claim 2, further comprising:
a photo-alignment layer on the plurality of the branch electrodes of the one of the first electrode and the second electrode,
wherein the photo-alignment layer determines the tilt angle of the liquid crystal molecule.

6. The liquid crystal display of claim 5, further comprising on the first substrate:
a gate line connected to the thin film transistor, and
a data line connected to the thin film transistor, the data line intersecting the gate line,
wherein the data line extend in a straight line.

7. The liquid crystal display of claim 6, wherein:
the transverse light blocking member having the width larger than that of the longitudinal light blocking member is lengthwise extended along the gate line, and
the longitudinal light blocking member having the width smaller than that of the transverse light blocking member is lengthwise extended along the data line.

8. The liquid crystal display of claim 7, wherein:
the gate line and the data line perpendicularly intersect each other.

9. The liquid crystal display of claim 8, wherein:
a plurality of pixels is defined on the first substrate, each pixel among the plurality of the pixels including:
a short sides in the extension direction of the plurality of branch electrodes, and
a long side in the direction perpendicular to the extension direction of the plurality of the branch electrodes.

10. The liquid crystal display of claim 5, wherein:
the photo-alignment layer is a photo-degradable alignment layer.

11. The liquid crystal display of claim 2, wherein:
a plurality of pixels is defined on the first substrate, each pixel among the plurality of the pixels including an upper region and a lower region,
a major axis of the liquid crystal molecule disposed in the upper region forms a first tilt angle with the direction perpendicular to the extension direction of the plurality of the branch electrodes in the state of no electric field applied to the liquid crystal layer,
a major axis of the liquid crystal molecule disposed in the lower region forms a second tilt angle with the direction perpendicular to the extension direction of the plurality of the branch electrodes in the state of no electric field applied to the liquid crystal layer, and
the first tilt angle and the second tilt angle are different from each other.

12. The liquid crystal display of claim 2, wherein:
a plurality of pixels is defined on the first substrate, among which a first pixel is adjacent to a second pixel and a plurality of liquid crystal molecules is disposed in each of the first pixel and the second pixel,
a major axis of each of the liquid crystal molecules disposed in the first pixel forms a first tilt angle with the direction perpendicular to the extension direction of the plurality of the branch electrodes in the state of no electric field applied to the liquid crystal layer,
a major axis of each of the liquid crystal molecules disposed in the second pixel forms a second tilt angle with the direction perpendicular to the extension direction of the plurality of the branch electrodes in the state of no electric field applied to the liquid crystal layer, and
the first tilt angle and the second tilt angle are different from each other.

13. The liquid crystal display of claim 2, wherein:
the tilt angle is about5 degrees to about 10 degrees.

14. The liquid crystal display of claim 7, wherein:
when the liquid crystal layer comprises ionic impurities, the ionic impurities in the liquid crystal layer are accumulated at the gate line.

15. The liquid crystal display of claim 14, wherein:
the transverse light blocking member lengthwise extended parallel to the extension direction of the plurality of the branch electrodes overlaps the ionic impurities accumulated at the gate line.

16. A method of manufacturing a liquid crystal display, comprising:
forming a thin film transistor on a first substrate,
forming a first electrode and a second electrode, and disposing an insulating layer between the first electrode and the second electrode, on the first substrate, wherein one of the first electrode and the second electrode includes a plurality of branch electrodes each extending in a same extension direction, and the other one of the first electrode and the second electrode having a planar shape, forming a photo-alignment layer on the first electrode or the second electrode, disposing a transverse light blocking member lengthwise extended parallel to the extension direction of the plurality of branch electrodes, disposing a longitudinal light blocking member lengthwise extended perpendicular to the extension direction of the plurality of branch electrodes, disposing the first substrate facing a second substrate, and forming a liquid crystal layer between the second substrate facing the first substrate, the liquid crystal layer including a liquid crystal molecule, wherein the liquid crystal molecule included in the liquid crystal layer has negative dielectric anisotropy, wherein a width of the transverse light blocking member taken perpendicular to the extension direction of the plurality of branch electrodes is larger than a width of the longitudinal light blocking member taken parallel to the extension direction of the plurality of branch electrodes, and an initial alignment direction of the liquid crystal molecule in a state of no electric field is substantially perpendicular to an extension direction of the transverse light blocking member having the width larger than that of the longitudinal light blocking member.

17. The method of claim 16, further comprising on the first substrate:

forming a gate line and a data line each connected to the thin film transistor, the data line intersecting the gate line, wherein the data line extends in a straight line.

18. The method of claim 17, wherein:

the transverse light blocking member having the width larger than that of the longitudinal light blocking member is lengthwise extended along the gate line, and the longitudinal light blocking member having the width smaller than that of the transverse light blocking member is lengthwise extended along the data line.

19. The method of claim 18, further comprising:

defining a plurality of pixels on the first substrate, a pixel among the plurality of pixels including an upper region and a lower region, wherein the forming the photo-alignment layer comprises:

masking the lower region of the pixel to incline a major axis of the liquid crystal molecule in the upper region at a first tilt angle, and masking the upper region of the pixel to incline a major axis of the liquid crystal molecule in the lower region at a second tilt angle, wherein the first tilt angle and the second tilt angle are different from each other.

20. The method of claim 18, further comprising:

defining a plurality of pixels on the first substrate, for which a first pixel is adjacent to a second pixel and a plurality of liquid crystal molecules is disposed in each of the first pixel and the second pixel, wherein the forming the photo-alignment layer comprises:

masking the second pixel to incline a major axis of the liquid crystal molecules in the first pixel at a first tilt angle, and masking the first pixel to incline a major axis of the liquid crystal molecules in the second pixel at a second tilt angle, the first tilt angle and the second tilt angle are different from each other.

* * * * *